United States Patent
Forbes et al.

(10) Patent No.: US 6,521,958 B1
(45) Date of Patent: Feb. 18, 2003

(54) MOSFET TECHNOLOGY FOR PROGRAMMABLE ADDRESS DECODE AND CORRECTION

(75) Inventors: Leonard Forbes, Corvallis, OR (US); Wendell P. Noble, Milton, VT (US); Eugene H. Cloud, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/383,804

(22) Filed: Aug. 26, 1999

(51) Int. Cl.$^7$ .............................................. H01L 31/119
(52) U.S. Cl. ........................ 257/391; 257/392; 257/405
(58) Field of Search ................................ 257/405, 391, 257/392; 438/286, 288

(56) References Cited

U.S. PATENT DOCUMENTS

| 3,992,701 A | * | 11/1976 | Abbas et al. |
| 5,172,204 A | * | 12/1992 | Hartstein |
| 5,763,912 A | * | 6/1998 | Parat et al. |
| 5,828,099 A | * | 10/1998 | Van Dort et al. ........... 257/314 |
| 5,851,893 A | * | 12/1998 | Gardner et al. |
| 6,180,957 B1 | * | 1/2001 | Miyasaka et al. |

FOREIGN PATENT DOCUMENTS

JP          6283713 A   * 10/1994

* cited by examiner

*Primary Examiner*—George Fourson
*Assistant Examiner*—Michelle Estrada
(74) *Attorney, Agent, or Firm*—Schwegman, Lundberg, Woessner & Kluth, P.A.

(57) ABSTRACT

Structures and methods for PLA capability on a DRAM chip according to a DRAM optimized process flow are provided by the present invention. These structures and methods include using MOSFET devices as re-programmable elements in memory address decode circuits in a DRAM integrated circuit. The structures and methods use the existing process sequence for MOSFET's in DRAM technology. An illustrative embodiment of the present invention includes a non-volatile, reprogrammable circuit switch. The circuit switch includes a metal oxide semiconductor field effect transistor (MOSFET) in a substrate. The MOSFET has a source region, a drain region, a channel region between the source and drain regions, and a gate separated from the channel region by a gate oxide. The MOSFET is a programmed MOSFET having a charge trapped in the gate oxide adjacent to the source region such that the channel region has a first voltage threshold region (Vt1) and a second voltage threshold region (Vt2), such that the programmed MOSFET operates at reduced drain source current.

33 Claims, 4 Drawing Sheets

MOSFET TECHNOLOGY FOR PROGRAMMABLE ADDRESS DECODE AND CORRECTION

FIELD OF THE INVENTION

The present invention relates generally to semiconductor integrated circuits and, more particularly, to MOSFET technology for programmable address decode and correction.

BACKGROUND OF THE INVENTION

Many electronic products need various amounts of memory to store information, e.g. data. One common type of high speed, low cost memory includes dynamic random access memory (DRAM) comprised of individual DRAM cells arranged in arrays. DRAM cells include an access transistor, e.g a metal oxide semiconducting field effect transistor (MOSFET) coupled to a capacitor cell. Programmable address decode circuits and buffers are needed in conjunction with the DRAM array to allow faulty rows and/or columns in a memory array to be replaced by functional redundant rows and/or columns. An example of a redundancy repair scheme is shown in U.S. Pat. No. 5,324,681 issued Lowrey on Jun. 28, 1994. Another is provided in U.S. Pat. No. 4,051,354 issued Choate on Sep. 27, 1997. Another is provide in U.S. Pat. No. 5,327,380 issued Kersh III on Jul. 5, 1994.

With the increasing array density of successive generations of DRAM chips, the attractiveness of merging other functions onto the chip, e.g. programmable address decode logic, also increases. However, any successful merged technology product must be cost competitive with the existing alternative of combining separate chips at the card or package level, each being produced with independently optimized technologies. Any significant addition of process steps to an existing DRAM technology in order to provide added functions such as high speed logic, SRAM or EEPROM becomes rapidly cost prohibitive due to the added process complexity cost and decreased yield. Thus, there is a need for a means of providing additional functions on a DRAM chip with little or no modification of the DRAM optimized process flow.

Programmable address decode circuits conventionally employ one time programmable switches in such decode circuits. Fuses and antifuses, present in circuits peripheral to the DRAM chips, are one method for constructing address decode logic. The fuse or antifuse integrally combines the functions of a switching element which makes the interconnection and a programming element which stores the state of the switching element, either "off" or "on," e.g. a blown or unblown fuse. A fuse or antifuse, however, has the disadvantage of not being reprogrammable. This single-time programmability makes the antifuse difficult to test and unsuitable for a large class of applications where reprogrammability is required. The fuse or antifuse further has the disadvantage on not being fabricated according to the DRAM process flow.

Micron Technology, Inc. taught in U.S. Pat. No. 5,324,681 which issued to Lowrey et al. on Jun. 28, 1994, that one time programmable (OTP) memory cells formed as MOSFETs could be used to replace laser/fuse programmable memory cells for applications such as OTP repair of DRAMs using redundant rows and columns of DRAM memory cells and OTP selection of options on a DRAM (such as fast page mode (FPM) or extended data out (EDO)). One of the key advantages of that capability is the ability to program the OTP memory cells after the DRAM memory chip is packaged (a decided advantage over previous solutions). However, the invention in the Lowrey patent still has the disadvantage of single-time programmability.

Another approach to solving the programmable switching is problem is described in U.S. Pat. No. 5,764,096, which issued to Lipp et al. on Jun. 9, 1998. U.S. Pat. No. 5,764,096 provides a general purpose non-volatile, reprogrammable switch, but does not achieve the same using the commonality in basic DRAM cell structure. Thus, the Lipp patent does not achieve the desired result of providing non-volatile memory functions on a DRAM chip with little or no modification of the DRAM process flow.

Still another alternative to programmable interconnects, e.g. logic switching circuits, uses a metal oxide semiconductor field effect transistor (MOSFET) as the switching element. The MOSFET is controlled by the stored memory bit of a programming element. Most commonly, this programming element is a dynamic random access memory (DRAM) cell. Such DRAM based field programmable gate arrays (FPGAs) are reprogrammable and use a DRAM process flow, but have a disadvantage in that the programming of the switching elements is lost whenever power is turned off. A separate, non-volatile memory cell must be used to store the programmed pattern on power down, and the FPGA must be reprogrammed each time the device is powered back up. This need again increases the fabrication complexity and requires significant additional chip surface space.

Thus, there is a need for DRAM technology compatible non-volatile memory cells which can be used as programmable logic arrays (PLAs). It is desirable that such DRAM technology non-volatile memory cells be fabricated on a DRAM chip with little or no modification of the DRAM process flow. It is further desirable that such DRAM technology non-volatile memory cells operate with lower programming voltages than that used by conventional non-volatile memory cells, yet still hold sufficient charge to withstand the effects of parasitic capacitances and noise due to circuit operation.

SUMMARY OF THE INVENTION

The above mentioned problems for creating DRAM technology compatible non-volatile memory cells as well as other problems are addressed by the present invention and will be understood by reading and studying the following specification. This disclosure teaches structures and methods using MOSFET devices as re-programmable elements in memory address decode circuits in a DRAM integrated circuit. The structures and methods use the existing process sequence for MOSFET's in DRAM technology.

In particular, an illustrative embodiment of the present invention includes a non-volatile, reprogrammable circuit switch. The circuit switch includes a metal oxide semiconductor field effect transistor (MOSFET) in a substrate. The MOSFET has a source region, a drain region, a channel region between the source and drain regions, and a gate separated from the channel region by a gate oxide. A wordline is coupled to the gate of the MOSFET. A first transmission line is coupled to the source region. A second transmission line is coupled to the drain region. The MOSFET is a programmed MOSFET having a charge trapped in the gate oxide adjacent to the source region such that the channel region has a first voltage threshold region (Vt1) and a second voltage threshold region (Vt2). The Vt2 is adjacent to the source region and Vt1 is adjacent to the drain region.

In the present invention, Vt2 has a greater voltage threshold than Vt1 due the charge trapped in the gate oxide adjacent to the source region. Hence, the programmed MOSFET of the present invention conducts significantly less current than a conventional MOSFET, particularly at low voltage drain voltages.

In another embodiment of the present invention, the relatively small change in the programmed MOSFET, in comparison to flash or EEPROM devices, is compensated for by using the novel circuit switch in a cross coupled latch. Array, system, and programming method embodiments are similarly included in the scope of the present invention.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DESCRIPTION OF THE PREFERRED EMBODIMENTS

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

According to the teachings of the present invention, normal MOSFETs can be programmed by operation in the reverse direction and utilizing avalanche hot electron injection to trap electrons in the gate oxide of the MOSFET. When the programmed MOSFET is subsequently operated in the forward direction the electrons trapped in the oxide are near the source and cause the channel to have two different threshold voltage regions. The novel programmed MOSFETs of the present invention conduct significantly less current than conventional MOSFETs, particularly at low drain voltages. These electrons will remain trapped in the gate oxide unless negative gate voltages are applied. The electrons will not be removed from the gate oxide when positive or zero gate voltages are applied. Erasure can be accomplished by applying negative gate voltages and/or increasing the temperature with negative gate bias applied to cause the trapped electrons to be re-emitted back into the silicon channel of the MOSFET.

There are two components to the effects of stress and hot electron injection. One component includes a threshold voltage shift due to the trapped electrons and a second component includes mobility degradation due to additional scattering of carrier electrons caused by this trapped charge and additional surface states. When a conventional MOSFET degrades, or is "stressed," over operation in the forward direction, electrons do gradually get injected and become trapped in the gate oxide near the drain. In this portion of the conventional MOSFET there is virtually no channel underneath the gate oxide. Thus the trapped charge modulates the threshold voltage and charge mobility only slightly.

Figure 1A:
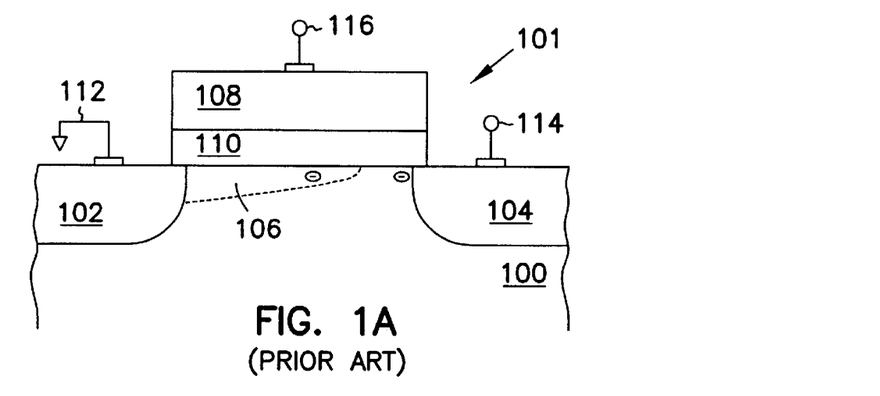
FIG. 1A is a block diagram of a metal oxide semiconductor field effect transistor (MOSFET) in a substrate according to the teachings of the prior art.

FIG. 1A is a block diagram of a metal oxide semiconductor field effect transistor (MOSFET) 101 in a substrate 100 as exists in the prior art. The MOSFET 101 includes a source region 102, a drain region 104, a channel region 106 in the substrate 100 between the source region 102 and the drain region 104. A gate 108 is separated from the channel region 108 by a gate oxide 110. A sourceline 112 is coupled to the source region 102. A bitline 114 is coupled to the drain region 104. A wordline 116 is coupled to the gate 108.

In conventional operation, a drain to source voltage potential (Vds) is set up between the drain region 104 and the source region 102. A voltage potential is then applied to the gate 108 via a wordline 116. Once the voltage potential applied to the gate 108 surpasses the characteristic voltage threshold (Vt) of the MOSFET a channel 106 forms in the substrate 100 between the drain region 104 and the source region 102. Formation of the channel 106 permits conduction between the drain region 104 and the source region 102, and a current signal (Ids) can be detected at the drain region 104.

Figure 1B:
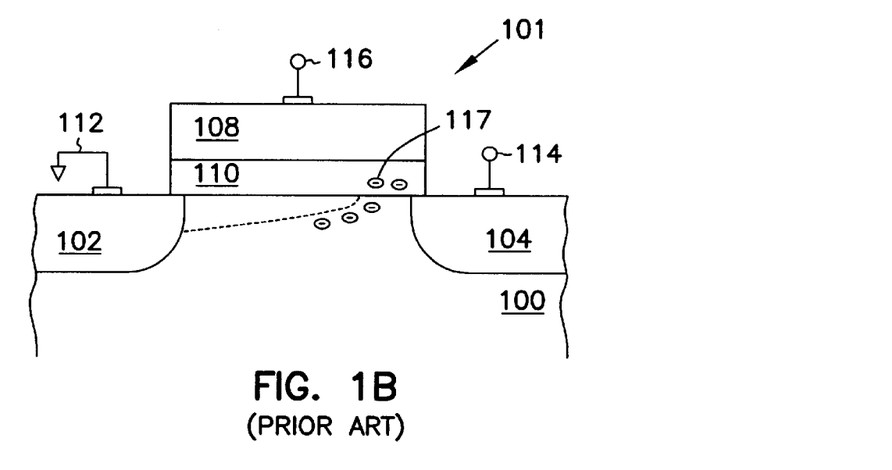
FIG. 1B illustrates the MOSFET of FIG. 1A operated in the forward direction showing some degree of device degradation due to electrons being trapped in near the drain region over gradual use.

In operation of the conventional MOSFET of FIG. 1A, some degree of device degradation does gradually occur for MOSFETs operated in the forward direction by electrons 117 becoming trapped in the gate oxide 110 near the drain region 104. This effect is illustrated in FIG. 1B. However, since the electrons 117 are trapped near the drain region 104 they are not very effective in changing the MOSFET characteristics.

Figure 1C:
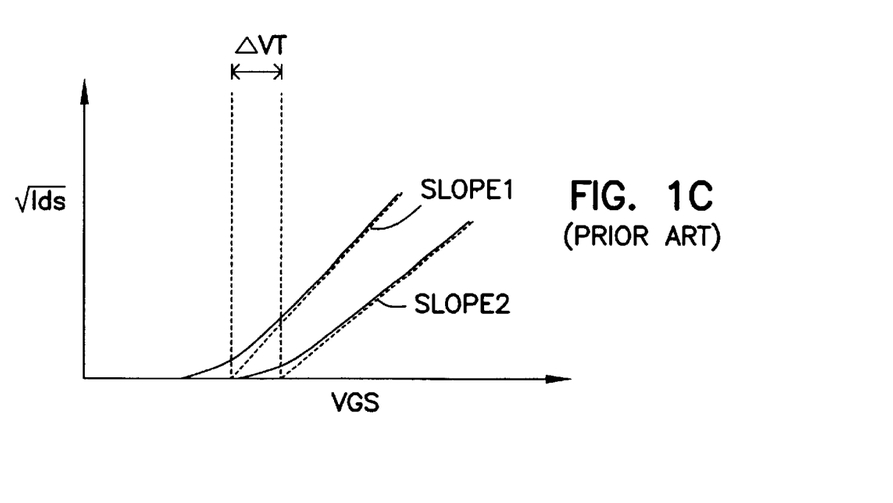
FIG. 1C is a graph showing the square root of the current signal (Ids) taken at the drain region of the conventional MOSFET versus the voltage potential (VGS) established between the gate and the source region.

FIG. 1C illustrates this point. FIG. 1C is a graph showing the square root of the current signal (Ids) taken at the drain region versus the voltage potential (VGS) established between the gate 108 and the source region 102. The slope of the plot of $\sqrt{Ids}$ versus VGS represents the change in the charge mobility in the channel 106.

In FIG. 1C, ΔVT represents the minimal change in the MOSFET's threshold voltage resulting from electrons gradually being trapped in the gate oxide 110 near the drain region 104, under normal operation, due to device degradation. This results in a fixed trapped charge in the gate oxide 110 near the drain region 104. Slope 1 represents the charge mobility in the channel 106 for FIG. 1A having no electrons trapped in the gate oxide 110. Slope 2 represents the charge mobility in the channel 106 for the conventional MOSFET of FIG. 1B having electrons 117 trapped in the gate oxide 110 near the drain region 104. As shown by a comparison of slope 1 and slope 2 in FIG. 1C, the electrons 117 trapped in the gate oxide 110 near the drain region 104 of the conventional MOSFET do not significantly change the charge mobility in the channel 106.

Figure 2A:
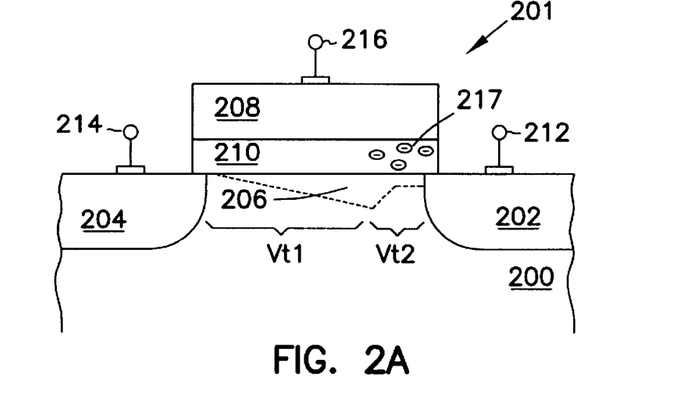
FIG. 2A is a block diagram of a programmed MOSFET which can be used as a circuit switch, or non volatile, reprogrammable switch according to the teachings of the present invention.

FIG. 2A is a block diagram of a programmed MOSFET which can be used as a circuit switch, or non volatile, reprogrammable switch 201 according to the teachings of the present invention. As shown in FIG. 2A the circuit switch 201 includes a MOSFET in a substrate 200 which has a first source/drain region 202, a second source/drain region 204, and a channel region 206 between the first and second source/drain regions, 202 and 204. In one embodiment, the first source/drain region 202 includes a source region 202 for the MOSFET and the second source/drain region 204 includes a drain region 204 for the MOSFET. FIG. 2A further illustrates a gate 208 separated from the channel region 206 by a gate oxide 210. A first transmission line 212 is coupled to the first source/drain region 202 and a second transmission line 214 is coupled to the second source/drain region 204. In one embodiment, the first transmission line includes a sourceline 212 and the second transmission line includes a bit line 214.

As stated above, circuit switch 201 is comprised of a programmed MOSFET. This programmed MOSFET has a charge 217 trapped in the gate oxide 210 adjacent to the first source/drain region 202 such that the channel region 206 has a first voltage threshold region (Vt1) and a second voltage threshold region (Vt2) in the channel 206. In one embodiment, the charge 217 trapped in the gate oxide 210 adjacent to the first source/drain region 202 includes a trapped electron charge 217.

FIG. 2A illustrates the Vt2 in the channel 206 is adjacent the first source/drain region 202 and that the Vt1 in the channel 206 is adjacent the second source/drain region 204. According to the teachings of the present invention, Vt2 has a higher voltage threshold than Vt1 due to the charge 217 trapped in the gate oxide 217 adjacent to the first source/drain region 202.

Figure 2B:
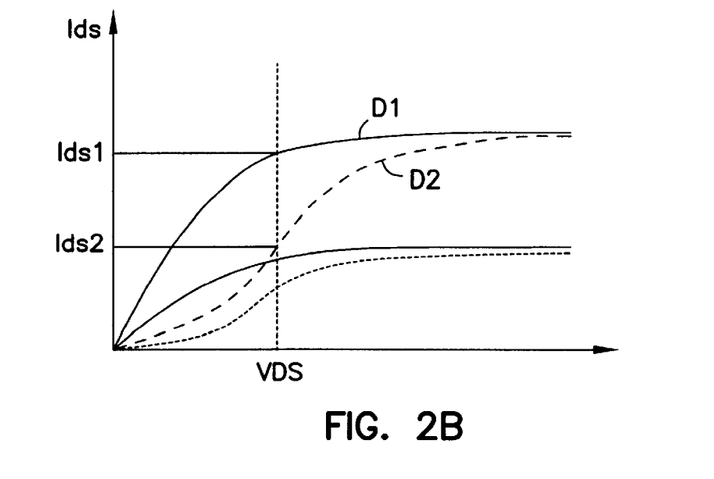
FIG. 2B is a graph plotting the current signal (Ids) detected at the drain region versus a voltage potential, or drain voltage, (VDS) set up between the drain region and the source region (Ids vs. VDS).

FIG. 2B is a graph plotting a current signal (Ids) detected at the second source/drain region 204 versus a voltage potential, or drain voltage, (VDS) set up between the second source/drain region 204 and the first source/drain region 202 (Ids vs. VDS). In one embodiment, VDS represents the voltage potential set up between the drain region 204 and the source region 202. In FIG. 2B, the curve plotted as D1 represents the conduction behavior of a conventional MOSFET which is not programmed according to the teachings of the present invention. The curve D2 represents the conduction behavior of the programmed MOSFET, described above in connection with FIG. 2A, according to the teachings of the present invention. As shown in FIG. 2B, for a particular drain voltage, VDS, the current signal (Ids2) detected at the second source/drain region 204 for the programmed MOSFET (curve D2) is significantly lower than the current signal (Ids2) detected at the second source/drain region 204 for the conventional MOSFET which is not programmed according to the teachings of the present invention. Again, this is attributed to the fact that the channel 206 in the programmed MOSFET of the present invention has two voltage threshold regions and that the voltage threshold, Vt2, near the first source/drain region 202 has a higher voltage threshold than Vt1 near the second source/drain region due to the charge 217 trapped in the gate oxide 217 adjacent to the first source/drain region 202.

Figure 2C:
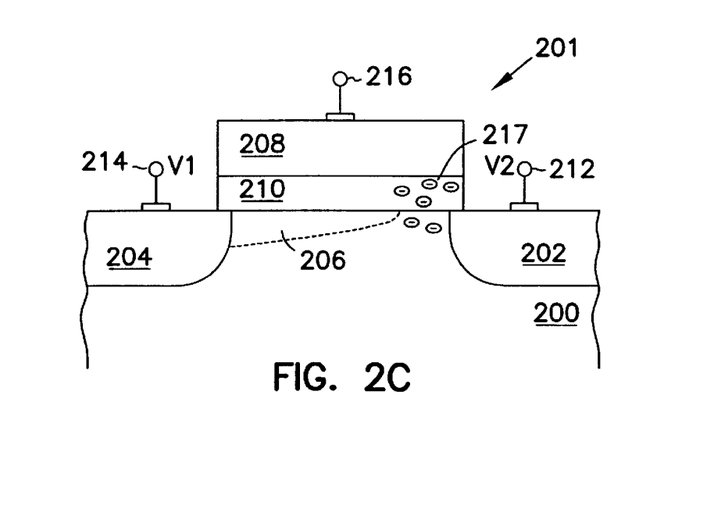
FIG. 2C is a block diagram suitable for explaining the method by which the MOSFET of the circuit switch, or non-volatile, reprogrammable switch 201 of the present invention can be programmed to achieve the embodiments of the present invention.

FIG. 2C is a block diagram suitable for explaining the method by which the MOSFET of the circuit switch, or non-volatile, reprogrammable switch 201 of the present invention can be programmed to achieve the embodiments of the present invention. As shown in FIG. 2C the method includes programming the MOSFET in a reverse direction. Programming the MOSFET in the reverse direction includes applying a first voltage potential V1 to a drain region 204 of the MOSFET. In one embodiment, applying a first voltage potential V1 to the drain region 204 of the MOSFET includes grounding the drain region 204 of the MOSFET as shown in FIG. 2C. A second voltage potential V2 is applied to a source region 202 of the MOSFET. In one embodiment, applying a second voltage potential V2 to the source region 202 includes applying a high positive voltage potential (VDD) to the source region 202 of the MOSFET, as shown in FIG. 2C. A gate potential VGS is applied to a gate 208 of the MOSFET. In one embodiment, the gate potential VGS includes a voltage potential which is less than the second voltage potential V2, but which is sufficient to establish conduction in the channel 206 of the MOSFET between the drain region 204 and the source region 202. As shown in FIG. 2C, applying the first, second and gate potentials (V1, V2, and VGS respectively) to the MOSFET creates a hot electron injection into a gate oxide 210 of the MOSFET adjacent to the source region 202. In other words, applying the first, second and gate potentials (V1, V2, and VGS respectively) provides enough energy to the charge carriers, e.g. electrons, being conducted across the channel 206 that, once the charge carriers are near the source region 202, a number of the charge carriers get excited into the gate oxide 210 adjacent to the source region 202. Here the charge carriers become trapped.

In one embodiment of the present invention, the method is continued by subsequently operating the MOSFET in the forward direction in its programmed state. Accordingly, the method includes re-coupling a sourceline 212 to the source region 202. A bit line 214 is re-coupled to the drain region. And, a gate potential is applied to the gate 208 by a wordline 216 such that a conduction channel is formed between the source and the drain regions.

Now in its programmed state, the conduction channel 206 of the MOSFET will have a first voltage threshold region (Vt1) adjacent to the drain region 204 and a second voltage threshold region (Vt2) adjacent to the source region 202, as explained and described in detail in connection with FIG. 2A. According to the teachings of the present invention, the Vt2 has a greater voltage threshold than the Vt1 due to the hot electron injection 217 into a gate oxide 210 of the MOSFET adjacent to the source region 202.

Figure 3A:
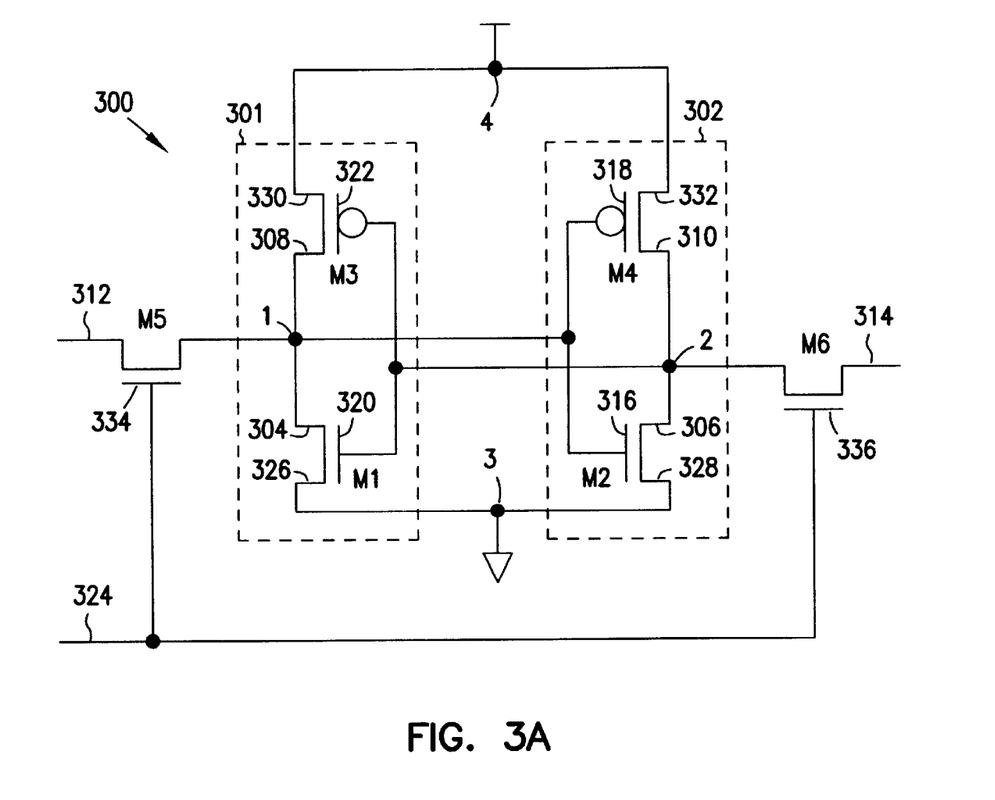
FIG. 3A is a schematic diagram illustrating a latch according to the teachings of the present invention.

FIG. 3A is a schematic diagram illustrating a latch 300 according to the teachings of the present invention. Latch 300 includes a pair of cross coupled inverters, 301 and 302 respectively. Each inverter, 301 and 302, includes a first conduction type MOSFET, M1 and M2 respectively. In one embodiment, the first conduction type MOSFET includes an n-channel metal oxide semiconductor (NMOS) transistor. Each inverter, 301 and 302, includes a second conduction type MOSFET, M3 and M4 respectively. In one embodiment, the second conduction type MOSFETs include p-channel metal oxide semiconductor (PMOS) transistors. Each MOSFET has a first source/drain region, a second source/drain region, a channel region between the first and the second source/drain regions, and a gate separated from the channel by a gate oxide. In one embodiment of the present invention, the first source/drain region of each MOSFET includes a source region and the second source/drain region includes a drain region.

As shown in FIG. 3A, the drain region 304 of MOSFET M1 is coupled to the drain region 308 of MOSFET M3 at node 1. Similarly, the drain region 306 of MOSFET M2 is coupled to the drain region 310 of MOSFET M4 at node 2. In the novel latch 300 shown in FIG. 3A, a source region 326 of MOSFET M1 is coupled to a first voltage potential at node 3. A source region 328 of MOSFET M2 is similarly coupled to the first voltage potential at node 3. Further a source region 330 of MOSFET M3 is coupled to a second voltage potential at node 4 and a source region 332 of MOSFET M4 is also coupled to the second voltage potential at node 4. In one embodiment, the first voltage potential at node 3 includes a ground potential. In one embodiment, the second voltage potential at node 4 includes a power supply voltage.

A first transmission line 312 is coupled to node 1. The first transmission line 312 is further coupled via node 1 to the gates 316 and 318 of MOSFETs M2 and M4 of inverter 302, or first inverter 302. At node 1, the first transmission line 312 is coupled to the drain regions 304 and 308 of MOSFETs M1 and M3 of inverter 301, or second inverter 301. A second transmission line 314 is coupled to node 2. The second transmission line 314 is further coupled via node 2 to the gates 320 and 322 of MOSFETs M1 and M3 of second inverter 301. At node 2, the second transmission line 314 is coupled to the drain regions 306 and 310 of MOSFETs M2 and M4 of first inverter 302.

In one embodiment, the latch 300 includes an input line 324 operatively coupled to the first transmission line 312 and the second transmission line 314. In the embodiment shown in FIG. 3A, the input line 324 is coupled to first transmission line 312 by MOSFET M5 and the input line 324 is coupled to the second transmission line 314 by MOSFET M6. The input line 324 couples to a gate 334 of MOSFET M5 and to a gate 336 of MOSFET M6.

According to the teachings of the present invention, at least one of the MOSFETs, M1, M2, M3, and M4 in latch 300 is a programmed MOSFET as described and explained in detail above in connection with FIGS. 2A–2C. The at least one programmed MOSFET includes a non-volatile, reprogrammable MOSFET. As described in connection with FIGS. 2A–2C the programmed MOSFET has a charge trapped in a gate oxide adjacent to the first source/drain region such that a channel region for the programmed MOSFET has a first voltage threshold region (Vt1) and a second voltage threshold region (Vt2). In one embodiment, the charge trapped in the gate oxide adjacent the first source/drain region includes a trapped electron charge.

The second voltage threshold region (Vt2) in the channel in the programmed MOSFET is adjacent to the first source/drain region of the programmed MOSFET. The first voltage threshold region (Vt1) in the channel in the programmed MOSFET is adjacent to the second source/drain region of the programmed MOSFET. According to the teachings of the present invention, the Vt2 has a higher voltage threshold than the Vt1. As described and explained in detail in connection with FIGS. 2A–2C, the programmed MOSFET conducts significantly less current than the unprogrammed MOSFETs of latch 300, particularly at low drain voltages.

Figure 3B:
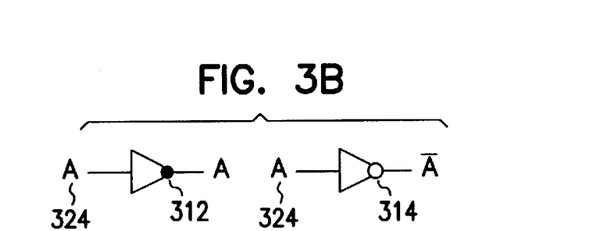
FIG. 3B is a logic diagram illustrating an operational embodiment of the latch of FIG. 3A which has a programmed MOSFET according to the teachings of the present invention.

FIG. 3B is a logic diagram illustrating an operational embodiment of latch 300 which has a programmed MOSFET according to the teachings of the present invention. In the example of FIG. 3B, MOSFET M1 has been programmed as described and explained in detail in connection with FIGS. 2A–2C. In operation, first transmission line 312 and second transmission line 314 are initially balanced at some positive voltage potential value. Next, a positive voltage potential is applied to input line 324 of FIG. 3A. In one embodiment, the voltage potential applied to input line 324 is greater than the voltage potential initially applied to balance the first transmission line 312 and the second transmission line 314.

The voltage potential applied to input line 324 enables, or turns "on," transistors M5 and M6, shown as NMOS transistors in FIG. 3A, permitting conduction through these transistors such that first transmission line 312 is coupled to node 1 and second transmission line 314 is coupled to node 2. The positive voltage potential applied to node 1 and node 2 is coupled to the gates 318 and 322 of transistors M4 and M3, shown as PMOS transistors in FIG. 3A. Here, the positive voltage potential applied to nodes 1 and 2 is not too large and allows transistors M4 and M3 to turn "on". The positive voltage potential applied to node 1 and node 2 is similarly coupled to the gates 316 and 320 of transistors M2 and M1, shown as NMOS transistors in FIG. 3A. Here, the positive voltage potential serves to turn "on" transistor M2.

However, due to the programmed state of MOSFET M1, MOSFET M1 conducts significantly less current than MOSFET M1 would in an unprogrammed state despite the positive voltage applied to it's gate 320. Therefore an output voltage on the first transmission line 312 is significantly changed and approaches to voltage of node 4. In other words, if the initial voltage applied to first transmission line 312 is represented by the value A/2, then the final output voltage on the first transmission line 312 after sensing is approximately the voltage potential A, or the voltage of node 4.

Conversely, since the unprogrammed NMOS M2 was turned "on" and conducts normally, an output voltage on the second transmission line 314 is significantly changed where the conduction through transistor M2 couples the second transmission line 314 to a different voltage potential at node 3. Thus, if the initial voltage applied to second transmission line 314 is represented by the value A/2, then the final output voltage on the second transmission line 314 after sensing has a new value represented by the value A*.

Figure 3C:
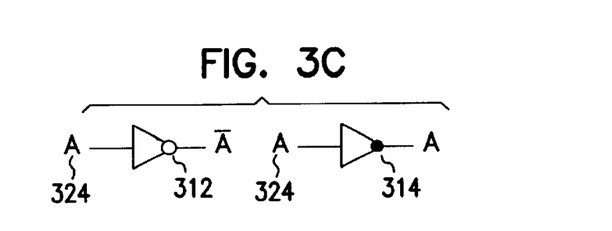
FIG. 3C is a logic diagram illustrating another operational embodiment of the latch of FIG. 3A which has a programmed MOSFET according to the teachings of the present invention.

FIG. 3C is a logic diagram illustrating another operational embodiment of latch 300 which has a programmed MOSFET according to the teachings of the present invention. In the example of FIG. 3C, MOSFET M2 has been programmed as described and explained in detail in connection with FIGS. 2A–2C. In operation, first transmission line 312 and second transmission line 314 are initially balanced at some positive voltage potential value. Next, a positive voltage potential is applied to input line 324 of FIG. 3A. In one embodiment, the voltage potential applied to input line 324 is larger than the voltage potential initially applied to balance the first transmission line 312 and the second transmission line 314.

The voltage potential applied to input line 324 enables, or turns "on," transistors M5 and M6, shown as NMOS transistors in FIG. 3A, permitting conduction through these transistors such that first transmission line 312 is coupled to node 1 and second transmission line 314 is coupled to node 2. The positive voltage potential applied to node 1 and node 2 is coupled to the gates 318 and 322 of transistors M4 and M3, shown as PMOS transistors in FIG. 3A. Here, the positive voltage potential applied to nodes 1 and 2 is not too large and allows transistors M4 and M3 to turn "on".

The positive voltage potential applied to node I and node 2 is also coupled to the gates 316 and 320 of transistors M2 and M1, shown as NMOS transistors in FIG. 3A. Here, the positive voltage potential serves to turn "on" transistor M1. However, due to the programmed state of MOSFET M2, MOSFET M2 conducts significantly less current than MOSFET M2 would in an unprogrammed state despite the positive voltage applied to it's gate 316. Therefore an output voltage on the second transmission line 314 is significantly changed and becomes the voltage of node 4. In other words, if the initial voltage applied to second transmission line 314 is represented by the value A/2, then the final output voltage on the second transmission line 314 after sensing is approximately the voltage potential A, or the voltage of node 4.

Conversely, since the unprogrammed NMOS M1 was turned "on" and conducts normally, an output voltage on the first transmission line 312 is significantly changed where the conduction through transistor M1 couples the first transmission line 312 to a different voltage potential at node 3. Thus, if the initial voltage applied to first transmission line 312 is represented by the value A/2, then the final output voltage on the first transmission line 312 after sensing has a new value represented by the value A*.

One of ordinary skill in the art will understand upon reading this disclosure that transistors M3 and M4 in latch 300 can similarly be programmed to comprise a programmed MOSFET, or non-volatile reprogrammable MOSFET according to the teachings of the present invention. Depending on which MOSFET in latch 300 has been programmed, the asymmetry in latch 300 will cause the latch 300 to flip one way or the other. Two distinctly different output configurations are possible.

The latch illustrated in FIG. 3A will have two distinctly different states depending upon the programming of the transistors M1 and M2. Two complementary outputs lines 312 and 314 are available for reading the programmed state of the latch, the latch can be addressed by using the line 324 and applying a large positive voltage to turn on transistors M5 and M6. One possible configuration of the latch is illustrated in FIG. 3B, inputting a positive voltage, A, on line 324 results in a complementary output, A*, on line 314 and a non-inverted output, A, on line 312. The other possible configuration of the latch is shown in FIG. 3C, inputting a positive voltage, A, on line 324 results in a non-inverted output, A, on line 314 and an inverted complementary output, A*, on line 312. In practice for instance only one output line might be utilized in which case an input, A, on line 324 can result in either an output, A, or A* on line 314 depending upon the programming of the transistors M1 and M2 in the latch.

Figure 4:
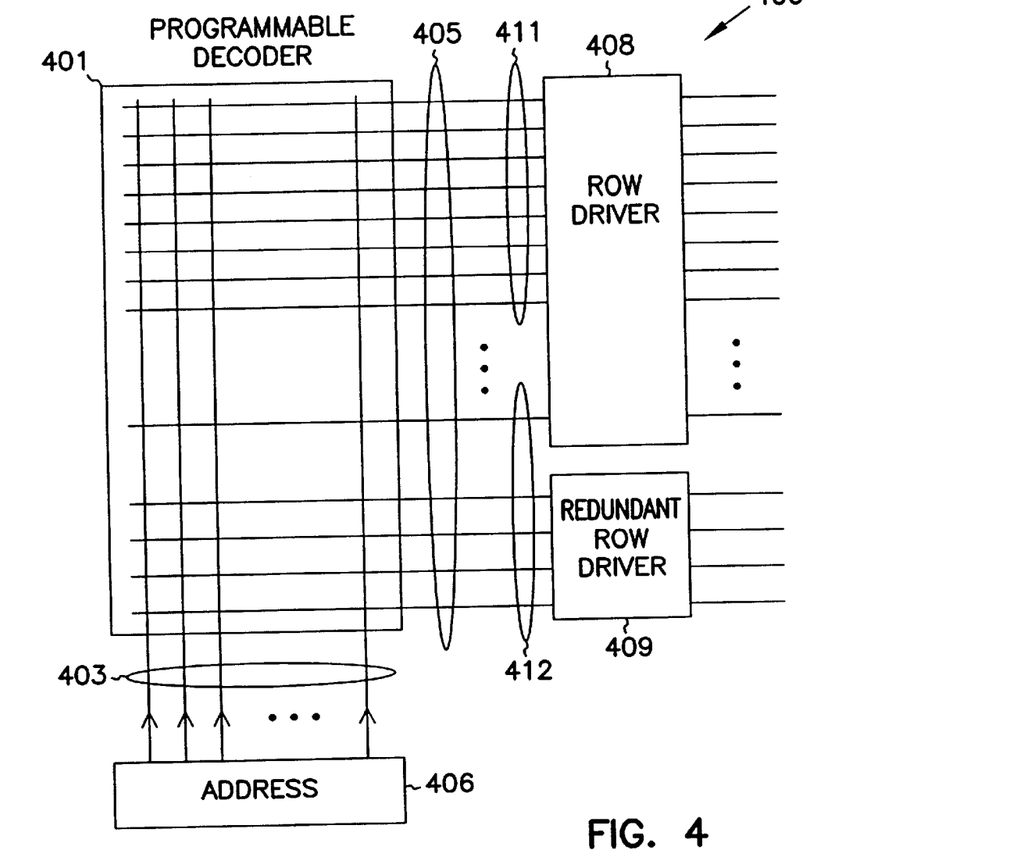
FIG. 4 is a block diagram illustrating an integrated circuit according to the teachings of the present invention.

FIG. 4 is a block diagram illustrating an integrated circuit 400 according to the teachings of the present invention. In one embodiment according to the teachings of the present invention, the integrated circuit 400 includes an address decoder portion for a memory. As shown in FIG. 4, the integrated circuit 400 includes a programmable decoder 401. According to the teachings of the present invention, the programmable decoder 401 includes an array of latches arranged in a matrix of rows and columns. The array of latches in the programmable decoder 401 includes non-volatile, reprogrammable latches having a programmed MOSFET as described and explained in detail in connection with FIGS. 3A–3C.

According to the teachings of the present invention, the array of latches in programmable decoder 401 are disposed at the intersection of a number of first transmission lines, shown collectively as 403, and a number of second transmission lines, shown collectively as 405. The number of first transmission lines 403 couple an address driver 406 to the array of latches in the programmable decoder 401. In one embodiment, the number of first transmission lines 403 includes a number of address input lines 403. The number of second transmission lines 405 couple a number of row drivers 408 and at least one redundant row driver 409 to the array of latches in the programmable decoder 401. In one embodiment, the number of second transmission lines 405 includes a number of output lines 405.

According to the teachings of the present invention, the latches within the array of latches in programmable decoder 401 can be programmed to have two distinct outputs as explained in connection with FIGS. 3A–3C. Depending on which MOSFET in a given latch is programmed, the asymmetry in the latch will cause the latch to flip one way or the other for two distinctly different output configurations. These programmed output configurations for the array of latches in the programmable decoder constitute a programmed logic array (PLA). The amount of signaling necessary to upset, or flip, the latch is similar to the considerations in the design of DRAM sense amplifiers. Thus, a 50 millivolt (mV) signal, or offset, in the threshold voltages for the MOSFETs of the latch will upset the latch. This insures programming in the PLA such that each latch will always output the same one of the two possible bistable states upon selection and activation.

As one of ordinary skill in the art will understand upon reading this disclosure, the two distinct output states can be used to allow faulty rows and/or columns in a memory array to be replaced by functional redundant rows and/or columns. For example, according to the teachings of the present invention, programmed latches in the array of latches in the programmable decoder 401 can be used to un-select a first set 411 of the second transmission lines 405 which couple to a primary row driver, e.g. row driver 408, and to instead select a second set 412 of the second transmission lines 405 which couple to a redundant row driver 409. Thus, the PLAs in the programmable decoder formed by latches with programmed MOSFETs according to the teachings of the present invention function in an equivalent manner to PLAs constructed from EEPROM devices. Under the present invention, however, the PLAs are formed according to a DRAM process technology which avoids the added complexity and cost associated with creating PLAs with EEPROM devices.

FIGS. 2C, 3A and 4, are illustrative of a method embodiment for performing address decoding in a memory according to the teachings of the present invention. The method includes coupling a number of address lines 403 to a number of latches 300 in an array of latches in programmable decoder 401. The method includes coupling a number of output lines 405 to the number of latches 300 in the array of latches in the programmable decoder 401 wherein each latch is disposed at an intersection of an address line 403 and an output line 405. At least one of the number of latches 300 is programmed as described in connection with FIGS. 3A–3C.

The programmed latch 300 includes a MOSFET programmed to be a non-volatile, reprogrammable MOSFET as described in connection with FIGS. 2A–2C, using hot electron injection to trap a charge in the gate oxide adjacent to the source region in the programmed MOSFET. According then to the teachings of the present invention, the latch having the programmed MOSFET is operated in the forward direction with the conduction channel of the programmed MOSFET having a first voltage threshold region (Vt1) adjacent to the drain region and having a second voltage threshold region (Vt2) adjacent to the source region of the MOSFET. Operating the latch in the forward direction includes operating the programmed MOSFET in the forward direction where Vt2 has a greater voltage threshold than the Vt1 due to the charge trapped in the gate oxide adjacent to the source region of the programmed MOSFET.

Further, performing address decoding in a memory according to the teachings of the present invention includes coupling an output line from at least one of the number of latches to a row driver when the at least one of the number of latches is in an unprogrammed state, and coupling the output line to a redundant row driver when the at least one of the number of latches is in a programmed state. Also, performing address decoding in a memory according to the teachings of the present invention includes unprogramming a latch in a programmed state. Unprogramming the latch in a programmed state includes removing a charge trapped in a gate oxide region adjacent to a source region in a MOSFET of the latch in a programmed state.

Programming the latches of the present invention, e.g. writing to a MOSFET in the latch, by channel hot electron injection and avalanche injection proceeds in a manner similar to hot electron injection and programming of Flash memory devices. The MOSFET to be programmed is turned on. For example, the latch 300 in FIG. 3A is selected using input line 324. The first transmission line 312 and the second transmission line 314 are controlled such that one transmission line is used to set the gate voltages in a first inverter of the latch 300 and the other transmission line is used to turn up the drain voltage across the MOSFET to be programmed in a second inverter of the latch 300. Extra lines and circuits (not shown) can be used in peripheral circuits as necessary to accomplish this. As with Flash memory devices programming is easily accomplished in second time frames or less.

Erasing the latches of the present invention, e.g. erasing a programmed MOSFET in a programmed latch, is accomplished by applying a large negative gate voltage to get tunneling of the electrons trapped in the oxide back to the silicon in a manner similar to tunnel erase of Flash memory devices. For example, with silicon on insulator (SOI) MOSFETs this could most easily be accomplished by biasing the desired first or second transmission lines connected to the gates in one inverter of the latch 300 negative and/or the p-type well positive. For bulk silicon MOSFET devices extra transistors might be required to disconnect some of the connections if parasitic diodes exist which can become forward biased.

Erase times are exponential functions of both voltage and temperature. A thick oxide device, e.g. having a gate oxide thickness of approximately 200 Angstroms (Å), takes a relatively long time to erase at room temperature, with a gate voltage of –12V. However, current flash memory technology uses gate voltages of –10V on approximately 100 Å thick gate oxides, which is a much higher electric field. Because of the exponential dependence on electric field in tunneling processes, this results in a much shorter erase time. In one embodiment, the erase time issue can also be reduced by increasing the temperature of the MOSFET while a negative gate voltage is applied.

Figure 5:
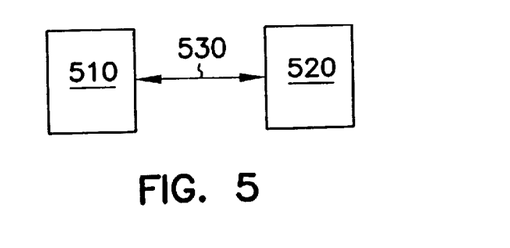
FIG. 5 is a block diagram illustrating an electronic system according to the teachings of the present invention.

FIG. 5 is a block diagram illustrating an electronic system according to the teachings of the present invention. As shown in FIG. 5, the electronic system includes a memory 510 and a processor 520 coupled to the memory by a system bus 530. In one embodiment, the processor and memory are located on a single semiconductor chip. The memory 510 includes a programmable decoder which has at least one latch having a programmed MOSFET according to the teachings of the present invention and as explained and described in detailed in connection with FIG. 4.

Conclusion

Thus, the ability to provide PLA capability on a DRAM chip according to a DRAM optimized process flow has been shown by the present invention. Advantages of the present invention include no extra processing steps to produce the non-volatile, reprogrammable MOSFETs. The size of the non-volatile, reprogrammable MOSFETs of the present invention, and the latches they are used in scale and shrink as the DRAM technology process margins are reduced. The non-volatile, reprogrammable MOSFETs of the present invention, and the latches they are used in operate at the same voltages as for conventional DRAM. Voltage multipliers are utilized for the programming and erase functions of the MOSFETs according to the teachings of the present invention. The voltage multipliers used for erase/programming are located in the peripheral circuit areas in the lay out of the DRAM and do not damage other device or circuits since they are not in close proximity. The non-volatile, reprogrammable MOSFETs of the present invention, and the latches they are used in, can be reprogrammable 5–10 times and should retain data for 12 years (4×life of average PC). Further the process yields associated with constructing the non-volatile, reprogrammable MOSFETs of the present invention, and the latches they are used in are near 100%, since they are fabricated according to a standard DRAM process flow.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A circuit switch, comprising:
   a metal oxide semiconductor field effect transistor (MOSFET) in a substrate, the MOSFET having a source region, a drain region, a channel region between the source and drain regions, and a gate separated from the channel region by a gate oxide;
   a wordline coupled to the gate;
   a first transmission line coupled to the source region;
   a second transmission line coupled to the drain region; and
   wherein the MOSFET is a programmed MOSFET having a charge trapped in the gate oxide adjacent to the source region and substantially no charge trapped in the gate oxide adjacent to the drain region such that the channel region has a first voltage threshold region (Vt1) and a second voltage threshold region (Vt2).

2. The circuit switch of claim 1, wherein the first transmission line includes a source line and wherein the second transmission line includes a bitline.

3. The circuit switch of claim 2 wherein the source line is operatively coupled to the source region of the MOSFET and the bitline is operatively coupled to the drain region.

4. The circuit switch of claim 1, wherein the charge trapped in the gate oxide adjacent the source region includes a trapped electron charge.

5. A circuit switch, comprising:
   a n-channel metal oxide semiconductor field effect transistor (NMOS) in a substrate, the NMOS having a source region, a drain region, a channel region between the source and region regions, and a gate separated from the channel region by a gate oxide;
   a wordline coupled to the gate;
   a source line operatively coupled to source region;
   a bitline operatively coupled to the drain region; and
   wherein the NMOS is a programmed NMOS having an electron charge trapped in the gate oxide adjacent to the source region and substantially no charge trapped in the gate oxide adjacent to the drain region such that the channel region has a first voltage threshold region (Vt1) and a second voltage threshold region (Vt2), Vt2 having a higher voltage threshold than Vt1.

6. The circuit switch of claim 1, wherein the second voltage threshold region (Vt2) in the channel is adjacent the source region, the first voltage threshold region (Vt1) in the channel is adjacent the drain region wherein the Vt2 has a higher voltage threshold than the Vt1.

7. The circuit switch of claim 1, wherein the programmed MOSFET includes a non-volatile, reprogrammable MOSFET.

8. A non-volatile, reprogrammable switch, comprising:
   a metal oxide semiconductor field effect transistor (MOSFET) in a substrate, the MOSFET having a source region, a drain region, a channel region between the source region and the drain region, and a gate separated from the channel region by a gate oxide;
   a wordline coupled to the gate;
   a first transmission line coupled to the source region;
   a second transmission line coupled to the drain region; and
   wherein the MOSFET is a programmed MOSFET having an electron charge trapped in the gate oxide adjacent to the source region and substantially no charge trapped in the gate oxide adjacent to the drain region such that the channel region has a first voltage threshold region (Vt1) adjacent to the drain region and a second voltage threshold region (Vt2) adjacent to the source region, the Vt2 having a greater voltage threshold than Vt1.

9. A latch on a substrate, comprising:
   a pair of cross coupled inverters, wherein each inverter includes a first conduction type MOSFET and a second conduction type MOSFET, each MOSFET has a source region, a drain region, a channel region between the source and the drain regions, and a gate separated from the channel region by a gate oxide;
   a first transmission line coupled to the gates of a first inverter in the cross coupled pair and to the drain regions of a second inverter in the cross coupled pair;
   a second transmission line coupled to the gates of a second inverter in the cross coupled pair and to the drain regions of a first inverter in the cross coupled pair; and
   wherein at least one of the MOSFETs is a programmed MOSFET having a charge trapped in the gate oxide adjacent to the source region and substantially no charge trapped in the gate oxide adjacent to the drain region such that the channel region has a first voltage threshold region (Vt1) and a second voltage threshold region (Vt2).

10. The latch of claim 9, wherein the first conduction type MOSFETs in each inverter include n-channel type MOSFETs (NMOS) and the second conduction type MOSFETs include p-channel type MOSFETs (PMOS).

11. The latch of claim 9, wherein the source regions in the first conduction type MOSFETs are coupled to a first voltage potential, and wherein the drain regions in the second conduction type MOSFETs are coupled to a second voltage potential.

12. The latch of claim 9, wherein the source of the at least one MOSFET is coupled to the source region of a MOSFET that is not a programmed MOSFET.

13. The latch of claim 9, wherein the latch further includes an input line operatively coupled to the first transmission line and the second transmission line.

14. The latch of claim 9, wherein the charge trapped in the gate oxide adjacent the source region includes a trapped electron charge.

15. The latch of claim 9, wherein the second voltage threshold region (Vt2) in the channel in the programmed MOSFET is adjacent to the source region of the programmed MOSFET, the first voltage threshold region (Vt1) in the channel in the programmed MOSFET is adjacent the drain region of the programmed MOSFET, and wherein the Vt2 has a higher voltage threshold than the Vt1.

16. A programmable decoder, comprising:
   an array of latches on a substrate, wherein each latch comprises:
   a pair of cross coupled inverters, wherein each inverter includes a first conduction type MOSFET and a second conduction type MOSFET, each MOSFET has a source region, a drain region, a channel region between the source and drain regions, and a gate separated from the channel region by a gate oxide;
   a number of first transmission lines coupled to the gates of the a first inverter in the cross coupled pair of inverters in the array of latches, and to the drain regions of a second inverter in the cross coupled pair of inverters in the array of latches;
   a number of second transmission lines coupled to the gates of the a second inverter in the cross coupled pair of inverters in the array of latches, and to the drain regions of a first inverter in the cross coupled pair of inverters in the array of latches; and wherein at least one latch includes a MOSFET which is a programmed MOSFET having a charge trapped in the gate oxide adjacent to the source region and substantially no charge trapped in the gate oxide adjacent to the drain region such that the channel region has a first voltage threshold region (Vt1) and a second voltage threshold region (Vt2).

17. The programmable decoder of claim 16, wherein the number of first transmission lines include a number of address input lines and wherein the number of second transmission lines includes a number of output lines.

18. The programmable decoder of claim 16, wherein the charge trapped in the gate oxide adjacent to the source region of the programmed MOSFET includes a trapped electron charge.

19. The programmable decoder of claim 16, wherein the second voltage threshold region (Vt2) in the channel of the programmed MOSFET is adjacent to the source region, the first voltage threshold region (Vt1) in the channel of the programmed MOSFET is adjacent to the drain region, and wherein the Vt2 has a higher voltage threshold than the Vt1.

20. The programmable decoder of claim 16, wherein the programmed MOSFET includes a non-volatile, reprogrammable MOSFET.

21. An integrated circuit, comprising:
an array of latches on a substrate, wherein each latch comprises:
a pair of cross coupled inverters, wherein each inverter includes a first conduction type MOSFET and a second conduction type MOSFET, each MOSFET has a source region, a source region, a channel region between the first and the second source/drain regions, and a gate separated from the channel region by a gate oxide;
a number of first transmission lines coupled to the gates of the a first inverter in the cross coupled pair of inverters in the array of latches, and to the drain regions of a second inverter in the cross coupled pair of inverters in the array of latches;
a number of second transmission lines coupled to the gates of the a second inverter in the cross coupled pair of inverters in the array of latches, and to the drain regions of a first inverter in the cross coupled pair of inverters in the array of latches;
an address driver coupled to the number of first transmission lines;
a number of row drivers and at least one redundant row driver coupled to the number of second transmission lines; and
wherein at least one latch includes a programmed MOSFET having a charge trapped in the gate oxide adjacent to the source region and substantially no charge trapped in the gate oxide adjacent to the drain region such that the channel region has a first voltage threshold region (Vt1) and a second voltage threshold region (Vt2).

22. The integrated circuit of claim 21, wherein the first conduction type MOSFETs in each inverter include n-channel type MOSFETs (NMOS) and the second conduction type MOSFETs include p-channel type MOSFETs (PMOS).

23. The integrated circuit of claim 21, wherein the source regions in the first conduction type MOSFETs are coupled to a first voltage potential, and wherein the source regions in the second conduction type MOSFETs are coupled to a second voltage potential.

24. The integrated circuit of claim 21, wherein the source of the at least one MOSFET is coupled to the source region of a MOSFET that is not a programmed MOSFET.

25. The integrated circuit of claim 21, wherein each latch in the array of latches further includes an input line operatively coupled to the first transmission line and the second transmission line.

26. The integrated circuit of claim 21, wherein the second voltage threshold region (Vt2) in the channel in the at least one programmed MOSFET is adjacent to the source region of the programmed MOSFET, the first voltage threshold region (Vt1) in the channel in the at least one programmed MOSFET is adjacent to the drain of the programmed MOSFET, and wherein the Vt2 has a higher voltage threshold than the Vt1 and the first source/drain region of the programmed MOSFET is a source region.

27. The integrated circuit of claim 21, wherein the number of first transmission lines include a number of address input lines, and wherein the number of second transmission lines include a number of output lines.

28. An electronic system, comprising:
a memory; and
a processor coupled to the memory, wherein the memory includes a programmable decoder, the programmable decoder comprising:
an array of latches on a substrate, wherein each latch includes a pair of cross coupled inverters, wherein each inverter includes an n-channel MOSFET (NMOS) and a p-channel MOSFET (PMOS), each MOSFET has a source region, a drain region, a channel region between the source and the drain regions, and a gate separated from the channel region by a gate oxide, and wherein the NMOS and PMOS of each inverter are coupled at the drain region;
a number of address input lines coupled to the gates of a first inverter in the cross coupled pair of inverters in the array of latches, and to the drain region of a second inverter in the cross coupled pair of inverters in the array of latches;
a number of output lines coupled to the gates of the a second inverter in the cross coupled pair of inverters in the array of latches, and to the drain region of a first inverter in the cross coupled pair of inverters in the array of latches; and
wherein at least one of the MOSFETs in the array of latches is a programmed MOSFET having a charge trapped in the gate oxide adjacent to the source region and substantially no charge trapped in the gate oxide adjacent to the drain region such that the channel region of the programmed MOSFET has a first voltage threshold region (Vt1) and a second voltage threshold region (Vt2).

29. The electronic system of claim 28, wherein the source regions in the PMOS transistors in each latch are coupled to a first voltage potential, and wherein the source regions in the NMOS transistors in each latch are coupled to a second voltage potential.

30. The electronic system of claim 28, wherein memory coupled to the processor includes a memory coupled to the processor on a single semiconductor chip.

31. The electronic system of claim 28, wherein each latch in the array of latches further includes an input line operatively coupled to the number of address lines and to the number of output lines.

32. The electronic system of claim 28, wherein the second voltage threshold region (Vt2) in the channel in the at least one programmed MOSFET is adjacent to the source region of the programmed MOSFET, the first voltage threshold region (Vt1) in the channel in the at least one programmed MOSFET is adjacent to the drain region of the programmed MOSFET, and wherein the Vt2 has a higher voltage threshold than the Vt1.

33. The electronic system of claim 28, wherein the number of address input lines include a number of address input lines coupled to each latch in the array of latches from an address driver, and wherein the number of output lines include a number of output lines coupled to at least one row driver and at least one redundant row driver.

* * * * *

UNITED STATES PATENT AND TRADEMARK OFFICE
CERTIFICATE OF CORRECTION

| | | |
|---|---|---|
| PATENT NO. | : 6,521,958 B1 | |
| APPLICATION NO. | : 09/383804 | |
| DATED | : February 18, 2003 | |
| INVENTOR(S) | : Eugene H. Cloud, Leonard Forbes and Wendell P. Noble, Jr. | |

It is certified that error appears in the above-identified patent and that said Letters Patent is hereby corrected as shown below:

On the Title page, (56), under "U.S. PATENT DOCUMENTS", column 1, line 1, insert the following below "3,992,701 A * 11/1976 Abbas et al.":

--4,051,354    9/1977    Choate, W.C. .............................. 235/312
   4,761,768    8/1988    Turner, J. E., et al. ...................... 365/201
   4,766,569    8/1988    Turner, J. E., et al. ...................... 365/185--

On the Title page, (56), under "U.S. PATENT DOCUMENTS", column 1, line 2, insert the following below "5,172,204 A * 12/1992 Hartstein":

--5,324,681    6/1994    Lowrey, T. A., et al. .................. 437/52
   5,327,380    7/1994    Kersh, III, D. V., et al. ............... 365/195--

On the Title page, (56), under "U.S. PATENT DOCUMENTS" column 1, line 3, insert the following below "5,763,912 A * 6/1998 Parat et al.":

--5,764,096    6/1998    Lipp, R. J., et al. ......................... 327/434--

On the Title page, (56), insert the following:

--OTHER PUBLICATIONS

Abbas, S.A., et al., "N-Channel Igfet Design Limitations Due to Hot Electron Trapping", *Technical Digest, International Electron Devices Meeting*, Washington, D.C., pp. 35-38, (December, 1975).

Forbes, L., et al., "Field Induced Re-Emission of Electrons Trapped in SiO", *IEEE Transactions on Electron Devices*, ED-26 (11), Briefs, pp. 1816-1818, (November, 1979).

Hwang, N., et al., "Tunneling and Thermal Emission of Electrons from a Distribution of Deep Traps in SiO", *IEE Transactions on Electron Devices*, 40(6), pp. 1100-1103, (June, 1993).--.

In column 1, line 27, delete "provide" and insert --provided-- therefor.

In column 2, line 6, delete "is" before "problem".

In column 13, line 32, in claim 5, delete "region" and insert --drain-- therefor.

UNITED STATES PATENT AND TRADEMARK OFFICE
CERTIFICATE OF CORRECTION

PATENT NO. : 6,521,958 B1
APPLICATION NO. : 09/383804
DATED : February 18, 2003
INVENTOR(S) : Eugene H. Cloud, Leonard Forbes and Wendell P. Noble, Jr.

It is certified that error appears in the above-identified patent and that said Letters Patent is hereby corrected as shown below:

In column 14, line 62, in claim 16, delete "the" before "a first".

In column 14, line 67, in claim 16, delete "the" before "a second".

In column 15, line 40, in claim 21, delete "the" before "a first".

In column 15, line 45, in claim 21, delete "the" before "a second".

In column 16, line 48, in claim 28, delete "the" after "gates of".

Signed and Sealed this

Fourth Day of September, 2007

JON W. DUDAS
*Director of the United States Patent and Trademark Office*